(12) United States Patent
Tsukashima

(10) Patent No.: US 11,646,711 B2
(45) Date of Patent: May 9, 2023

(54) FILTER CIRCUIT AND BALUN CIRCUIT

(71) Applicant: SUMITOMO ELECTRIC INDUSTRIES, LTD., Osaka (JP)

(72) Inventor: Koji Tsukashima, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 45 days.

(21) Appl. No.: 17/445,336

(22) Filed: Aug. 18, 2021

(65) Prior Publication Data

US 2022/0069794 A1  Mar. 3, 2022

(30) Foreign Application Priority Data

Aug. 26, 2020 (JP) .............................. JP2020-142969

(51) Int. Cl.
*H03H 7/42* (2006.01)
*H01P 5/10* (2006.01)
*H03H 7/09* (2006.01)
*H01P 5/18* (2006.01)
*H03H 7/01* (2006.01)

(52) U.S. Cl.
CPC ............... *H03H 7/422* (2013.01); *H01P 5/10* (2013.01); *H01P 5/184* (2013.01); *H03H 7/0153* (2013.01); *H03H 7/09* (2013.01)

(58) Field of Classification Search
CPC . H03H 7/42; H03H 7/422; H03H 7/09; H01P 5/10

USPC ......................... 333/109, 116–119, 177, 204
See application file for complete search history.

(56) References Cited

U.S. PATENT DOCUMENTS

| 6,285,273 B1 * | 9/2001 | Morikawa | H01F 19/04 336/200 |
| 10,476,436 B2 | 11/2019 | Kawasaki et al. | |
| 2016/0142037 A1 * | 5/2016 | Tanaka | H01F 27/29 333/26 |
| 2019/0068356 A1 * | 2/2019 | Matsumura | H04L 25/02 |

FOREIGN PATENT DOCUMENTS

JP  2016-158245  9/2016

* cited by examiner

*Primary Examiner* — Rakesh B Patel
(74) *Attorney, Agent, or Firm* — IPUSA, PLLC

(57) ABSTRACT

A filter circuit includes a branch line coupler and a balun circuit having an input terminal connected to the branch line coupler to receive a signal, a first line connected to the input terminal and having a length comparable to a quarter of an electrical length of one wavelength at a frequency of the signal, a second line connected to the input terminal and having a length comparable to the quarter, a third line connected to the second line and having a length comparable to the quarter, and a fourth line connected to the third line and electromagnetically coupled to the first line, the fourth line having a length comparable to the quarter, wherein an end of the first line and an end of the fourth line are both connected to a ground or open-circuited, or are connected to two respective terminating resistors whose resistance values are equal.

16 Claims, 8 Drawing Sheets

FILTER CIRCUIT AND BALUN CIRCUIT

CROSS REFERENCE TO RELATED APPLICATIONS

The present application is based on and claims priority to Japanese Patent Application No. 2020-142969, filed on Aug. 26, 2020, with the Japanese Patent Office, the entire contents of which are incorporated herein by reference.

BACKGROUND OF THE INVENTION

1. Field of the Invention

The present invention relates to a filter circuit and a balun circuit.

2. Description of the Related Art

An example of a related-art one-port circuit includes a coupled line and a transmission line, wherein the through terminal and isolation terminal of the coupled line are grounded, with the transmission line connecting the input terminal and coupling terminal of the coupled line (see Patent Document 1, for example).

The one-port circuit as noted above is designed to reduce phase noise, and is not designed to reduce signal reflection with respect to frequencies of interest.

Accordingly, there may be a need for a filter circuit and a balun circuit capable of reducing signal reflection with respect to frequencies of interest.

[Patent Document 1] Japanese Laid-open Patent Publication No. 2016-158245

SUMMARY OF THE INVENTION

According to an embodiment, a filter circuit includes a branch line coupler having a first terminal, a second terminal, a third terminal, and a fourth terminal which are connected together in the order named through a conductor line in a loop shape, the first terminal serving as an input port, and the fourth terminal serving as an output port, and a first balun circuit connected to either the second terminal or the third terminal, wherein the first balun circuit includes a first input terminal connected to either the second terminal or the third terminal to receive a radio-frequency signal, a first transmission line having one end connected to the first input terminal and having a length comparable to a quarter of an electrical length of one wavelength at a frequency of the radio-frequency signal, a second transmission line having one end connected to the first input terminal and having a length comparable to a quarter of the electrical length, a third transmission line having one end connected to another end of the second transmission line and having a length comparable to a quarter of the electrical length, and a fourth transmission line having one end connected to another end of the third transmission line and electromagnetically coupled to the first transmission line, the fourth transmission line having a length comparable to a quarter of the electrical length, wherein another end of the first transmission line and another end of the fourth transmission line are both connected to a ground, or are both open-circuited, or are connected to two respective terminating resistors whose resistance values are equal to each other.

According to at least one embodiment, a filter circuit and a balun circuit capable of reducing signal reflection with respect to frequencies of interest are provided.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 1:
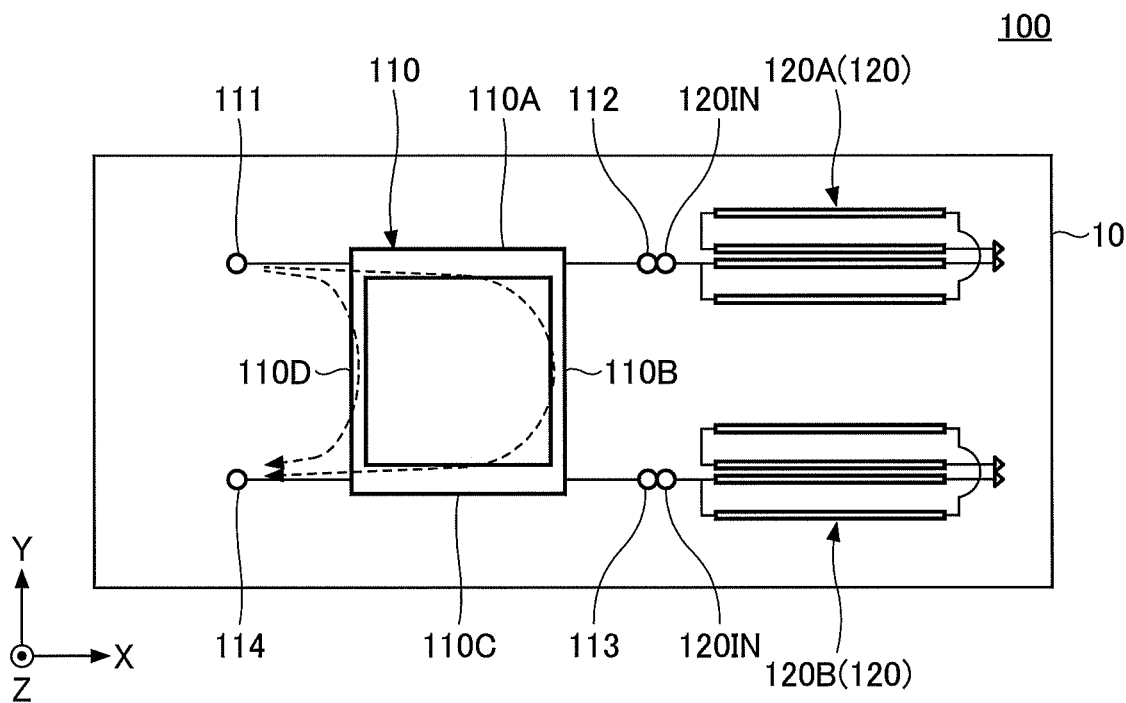
FIG. 1 is a drawing illustrating an example of a filter circuit according to an embodiment.

Embodiments will be described in the following.
[Description of Embodiments of the Present Disclosures]

[1] A filter circuit according to one aspect of the present disclosures includes a first branch line coupler having a first terminal, a second terminal, a third terminal, and a fourth terminal which are connected together in the order named through a first conductor line forming a loop, the first terminal serving as a first input port, and the fourth terminal serving as a first output port; and a first balun circuit connected to either the second terminal or the third terminal, wherein the first balun circuit includes a first input terminal connected to either the second terminal or the third terminal to receive a radio-frequency signal, a first transmission line having one end connected to the first input terminal and having a length comparable to a quarter of a first electrical length of one wavelength at a frequency of the radio-frequency signal, a second transmission line having one end connected to the first input terminal and having a length comparable to a quarter of the first electrical length, a third transmission line having one end connected to another end of the second transmission line and having a length comparable to a quarter of the first electrical length, and a fourth transmission line having one end connected to another end of the third transmission line and electromagnetically coupled to the first transmission line, the fourth transmission line having a length comparable to a quarter of the first electrical length, wherein another end of the first transmission line and another end of the fourth transmission line are both connected to a ground, or are both open-circuited, or are connected to two respective terminating resistors whose resistance values are equal to each other.

In the filter circuit according to the one aspect of the present disclosures, a signal phase at the one end of the first transmission line of the first balun circuit which is connected to either the second terminal or the third terminal of the first branch line coupler differs by 180 degrees from a signal phase at the one end of the fourth transmission line, so that signal reflection is effectively reduced at the first input terminal of the first balun circuit. As a result, a reflection coefficient is effectively reduced for the frequency which is included in the radio-frequency signal transmitted through the first branch line coupler and at which the length of the first transmission line and the fourth transmission line becomes equal to a quarter wavelength, thereby enabling removal thereof from the radio-frequency signals transmitted through the first conductor line of the first branch line coupler. A filter circuit capable of reducing signal reflection with respect to frequencies of interest is thus provided.

[2] In the configuration as described in [1], the first conductor line of the first branch line coupler may be a rectangular loop conductor line, and the first terminal, the second terminal, the third terminal, and the fourth terminal may be connected to the corners of the rectangular loop of the first conductor line. The rectangular loop shape of the first conductor line allows the line length and the line width to be easily set, and also allows the impedance of the first branch line coupler to be easily set. As a result, a filter circuit is provided that allows the impedance of the first branch line coupler to be easily set and that is capable of reducing signal reflection with respect to frequencies of interest.

[3] In the configuration as described in [1] or [2], the first balun circuit may be disposed inside the area enclosed by the first conductor line. Placing the first balun circuit inside the area enclosed by the first conductor line contributes to size reduction. A filter circuit is thus provided that achieves size reduction and that is capable of reducing signal reflection with respect to frequencies of interest.

[4] In any one of the configurations as described in [1] through [3], the first transmission line, the second transmission line, the third transmission line, and the fourth transmission line may have an equal length. Provision of the first transmission line through the fourth transmission line having the same length allows the frequency characteristics of the first transmission line through the fourth transmission line to be equal to each other. A reflection coefficient is thus effectively reduced for the frequency band at which the length of the first transmission line through the fourth transmission line becomes equal to a quarter wavelength, which enables removal thereof from the radio-frequency signals transmitted through the conductor line of the branch line coupler. A filter circuit capable of more effectively reducing signal reflection with respect to frequencies of interest is thus provided.

[5] In any one of the configurations as described in [1] through [3], the first transmission line and the fourth transmission line may have an equal length, and the second transmission line and the third transmission line may have an equal length, with the length of the first transmission line and the fourth transmission line and the length of the second transmission line and the third transmission line being different from each other. Use of different lengths between the length of the first transmission line and the fourth transmission line and the length of the second transmission line and the third transmission line causes frequency characteristics of the first transmission line and the fourth transmission line to differ from those of the second transmission line and the third transmission line, thereby serving to widen the frequency band in which reflection is reduced with respect to the first balun circuit. A filter circuit capable of reducing signal reflection with respect to frequencies of interest in a wider frequency band is thus provided.

[6] In any one of the configurations as described in [1] through [5], the first transmission line and the fourth transmission line may extend in parallel to, and in proximity of, each other. Provision of the first transmission line and the fourth transmission line extending in parallel to, and in proximity of, each other achieves an increased electromagnetic coupling between the first transmission line and the fourth transmission line. A reflection coefficient is thus effectively reduced for the frequency band at which the length of the first transmission line through the fourth transmission line becomes equal to a quarter wavelength, which enables removal thereof from the radio-frequency signals transmitted through the conductor line of the branch line coupler. A filter circuit capable of more effectively reducing signal reflection with respect to frequencies of interest is thus provided.

[7] In any one of the configurations as described in [1] through [6], a second balun circuit may be further provided that is connected to the remaining one of the second terminal and the third terminal, wherein the second balun circuit includes a second input terminal connected to the remaining one of the second terminal and the third terminal to receive the radio-frequency signal, a fifth transmission line having one end connected to the second input terminal and having a length comparable to a quarter of an electrical length of one wavelength at a frequency of the radio-frequency signal, a sixth transmission line having one end connected to the second input terminal and having a length comparable to a quarter of the electrical length, a seventh transmission line having one end connected to another end of the sixth transmission line and having a length comparable to a quarter of the electrical length; and an eighth transmission line having one end connected to another end of the seventh transmission line and electromagnetically coupled to the fifth transmission line, the eighth transmission line having a length comparable to a quarter of the electrical length, wherein another end of the fifth transmission line and another end of the eighth transmission line are both connected to a ground, or are both open-circuited, or are connected to two respective terminating resistors whose resistance values are equal to each other.

A signal phase at the one end of the fifth transmission line of the second balun circuit which is connected to the remaining one of the second terminal and the third terminal of the first branch line coupler differs by 180 degrees from a signal phase at the one end of the eighth transmission line, so that signal reflection is effectively reduced at the second input terminal of the second balun circuit. As a result, signal reflection is effectively reduced at both the second terminal and the third terminal for the frequency at which the length of the first transmission line, the fourth transmission line, the fifth transmission line, and the eighth transmission line becomes equal to a quarter wavelength, which enables removal thereof from the radio-frequency signals transmitted through the first conductor line of the first branch line coupler. A filter circuit capable of more effectively reducing signal reflection with respect to frequencies of interest is thus provided.

[8] Any one of the configurations as described in [1] through [6] is further provided with a second branch line coupler having a fifth terminal, a sixth terminal, a seventh terminal, and an eighth terminal which are connected together in the order named through a second conductor line forming a loop, the fifth terminal serving as a second input port, and the eighth terminal serving as a second output port, and a second balun circuit connected to either the sixth terminal or the seventh terminal, wherein the second balun circuit includes a second input terminal connected to either the sixth terminal or the seventh terminal to receive a radio-frequency signal transmitted through the second branch line coupler, a fifth transmission line having one end connected to the second input terminal and having a length comparable to a quarter of a second electrical length of one wavelength at a frequency of the radio-frequency signal transmitted through the second branch line coupler, a sixth transmission line having one end connected to the second input terminal and having a length comparable to a quarter of the second electrical length, a seventh transmission line having one end connected to another end of the sixth transmission line and having a length comparable to a quarter of the second electrical length, and an eighth transmission line having one end connected to another end of the seventh transmission line and electromagnetically coupled to the fifth transmission line, the eighth transmission line having a length comparable to a quarter of the second electrical length, wherein another end of the fifth transmission line and another end of the eighth transmission line are both connected to a ground, or are both open-circuited, or are connected to two respective terminating resistors whose resistance values are equal to each other.

Further inclusion of both the second branch line coupler similar to the first branch line coupler and the second balun circuit similar to the first balun circuit effectively reduces a reflection coefficient at the frequency that corresponds to the first balun circuit and the second balun circuit and that is included in the radio-frequency signal transmitted through the first conductor line and the second conductor line of the two branch line couplers, thereby removing such a frequency from the radio-frequency signal transmitted through the first conductor line of the first branch line coupler. A filter circuit capable of reducing signal reflection with respect to frequencies of interest in the two branch line couplers is thus provided.

[9] In the configuration as described in [8], the length of the first conductor line of the first branch line coupler and the length of the second conductor line of the second branch line coupler are different from each other, and the length of the first transmission line and the fourth transmission line in the first balun circuit and the length of the fifth transmission line and the eighth transmission line in the second balun circuit are different from each other, wherein the length of the second transmission line and the third transmission line in the first balun circuit and the length of the sixth transmission line and the seventh transmission line in the second balun circuit may be different from each other.

Due to the difference in size between the first branch line coupler and the second branch line coupler as well as the difference in size between the first balun circuit and the second balun circuit, a reflection coefficient is reduced at the frequency that is included in the radio-frequency signal transmitted through the first branch line coupler and that corresponds to the first balun circuit, and a reflection coefficient is reduced at the frequency that is included in the radio-frequency signal transmitted through the second branch line coupler and that corresponds to the second balun circuit. A filter circuit is thus provided that is capable of reducing signal reflection in the two branch line couplers with respect to respective, different frequencies of interest.

[10] A balun circuit according to one aspect of the present disclosures includes an input terminal configured to receive a radio-frequency signal, a first transmission line having one end connected to the input terminal and having a length comparable to a quarter of an electrical length of one wavelength at a frequency of the radio-frequency signal, a second transmission line having one end connected to the first input terminal and having a length comparable to a quarter of the electrical length, a third transmission line having one end connected to another end of the second transmission line and having a length comparable to a quarter of the electrical length, and a fourth transmission line having one end connected to another end of the third transmission line and electromagnetically coupled to the first transmission line, the fourth transmission line having a length comparable to a quarter of the electrical length, wherein another end of the first transmission line and another end of the fourth transmission line are both connected to a ground, or are both open-circuited, or are connected to two respective terminating resistors whose resistance values are equal to each other.

In the balun circuit according to the one aspect of the present disclosures, a signal phase at the one end of the first transmission line differs by 180 degrees from a signal phase at the one end of the fourth transmission line, so that signal reflection is effectively reduced at the input terminal of the balun circuit. As a result, a reflection coefficient is effectively reduced for particular frequencies which are included in the radio-frequency signal and which correspond to the length of the first transmission line and the fourth transmission line. A balun circuit capable of reducing signal reflection with respect to frequencies of interest is thus provided.

[Details of Embodiments of the Present Disclosures]

In the following, embodiments of the present disclosures will be described in detail, but the present embodiments are not limited to those disclosed herein. In the specification and drawings, elements having substantially the same functions or configurations are referred to by the same numerals, and a duplicate description thereof may be omitted.

EMBODIMENT

[Configuration of Filter Circuit 100]

FIG. 1 is a drawing illustrating an example of a filter circuit 100 according to an embodiment. In the following, a description will be given with an XYZ coordinate system defined herein. In the following, further, a plan view refers to an X-Y plane view. For the sake of convenience of explanation, the negative Z direction is referred to by using terms such as "lower" or "under", and the positive Z direction is referred to by using terms such as "upper" or "over", but the use of these terms for expressing vertical directions is not intended to limit the orientation of the described object when used.

Figure 2:
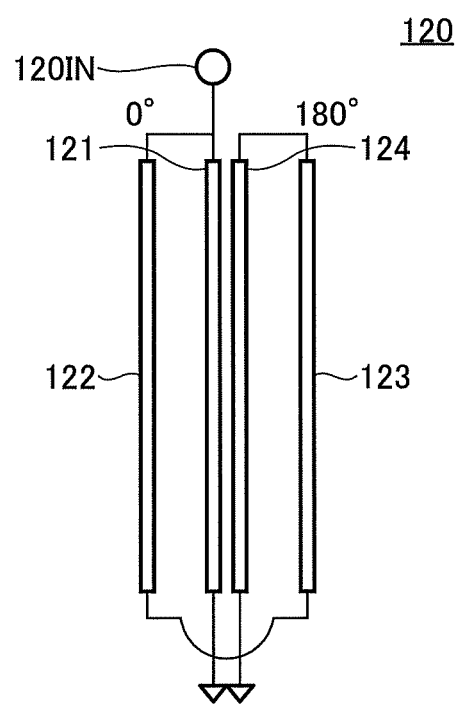
FIG. 2 is a drawing illustrating a balun circuit.

The filter circuit 100 includes a substrate 10, a branch line coupler 110, and two balun circuits 120A and 120B. The balun circuits 120A and 120B are examples of the first balun circuit and the second balun circuit, respectively. In the following, the two balun circuits 120A and 120B are simply referred to as the balun circuit(s) 120 when there is no intension to distinguish them. A description will be given of the balun circuit 120 by referring to FIG. 2 in addition to FIG. 1. FIG. 2 is a drawing illustrating the balun circuit 120.

[Configuration of Substrate 10]

The substrate 10 is an interconnect substrate according to the FR4 (flame retardant type 4) standard, for example. The branch line coupler 110 and the two balun circuits 120

(120A and 120B) are disposed on the upper surface of the substrate 10. As an example, the branch line coupler 110 is formed as a metal pattern on the surface of the substrate 10, and the two balun circuits 120 (120A and 120B) are chip components mounted to the surface of the substrate 10. The substrate 10 may have radio-frequency circuits or the like for radio-frequency signals implemented thereon, for example, in addition to the branch line coupler 110 and the two balun circuits 120 (120A and 120B). The frequency of the radio-frequency signal, which may be from 5 GHz to 40 GHz, for example, belongs to the frequency band of the millimeter-wave band.

[Configuration and Operation of Branch Line Coupler 110]

The branch line coupler 110 is a four-terminal circuit having conductor lines 110A, 110B, 110C, and 110D and terminals 111, 112, 113, and 114. The conductor lines 110A through 110D are an example of a first conductor line connected in a rectangular loop shape in a plan view. The terminals 111, 112, 113, and 114 are examples of a first terminal, a second terminal, a third terminal, and a fourth terminal, respectively, and are connected in the order named in a plan view through the conductor lines 110A through 110D. The conductor lines 110A through 110D may have a shape different from a rectangular loop shape (e.g., a circular loop shape).

The terminal 111 is an input port, and the terminal 114 is an output port. The terminal 112 is connected to an input terminal 120IN of the balun circuit 120A. The terminal 113 is connected to an input terminal 120IN of the balun circuit 120B. The terminal 111 serving as the input port and the terminal 114 serving as the output port are connected to a radio-frequency circuit or the like external to the filter circuit 100. A high frequency signal is input into the terminal 111. The radio-frequency signal upon being filtered by the filter circuit 100 is output from the terminal 114.

The conductor lines 110A through 110D are implemented as micro-strip line as an example. Micro-strip lines are realized as metal lines such as a patterned copper foil on the surface (i.e., upper surface) of the substrate 10 and a ground layer disposed inside or on the lower surface of the substrate 10. Here, metal lines such as a patterned copper foil disposed on the surface (i.e., the upper surface) of the substrate 10 are illustrated as the conductor lines 110A through 110D. Further, although the terminals 111 through 114 are illustrated such as to extend from the corners of the conductor lines 110A through 110D in order to facilitate the understanding of the configuration of the branch line couplers 110, it does not matter whether the terminals 111 through 114 are disposed at the corners of the conductor lines 110A through 110D or extend therefrom. In the case of using extensions, the extensions may be micro-strip lines or the like.

The conductor lines 110A through 110D each have a length comparable to ¼ of an electrical length $\lambda e_1$ of one wavelength at the design frequency f1 of the branch line coupler 110 (i.e., the frequency at which transmission is reduced). The conductor lines 110A through 110D have an equal length. Here, the length comparable to ¼ of the electrical length $\lambda e_1$ is intended to include not only $\lambda e_1/4$ but also a length slightly shorter than $\lambda e_1/4$ or a length slightly longer than $\lambda e_1/4$ in consideration of impedance matching and the like.

Further, the line widths of the opposing conductor lines 110A and 110C are equal to each other, and the line widths of the opposing conductor lines 110B and 110D are equal to each other. It may be nonetheless acceptable for the line width of the conductor lines 110A and 110C to be different from the line width of the conductor lines 110B and 110D. This is for impedance adjustment. The term "line width" refers to the width measured perpendicularly to the longitudinal directions in which the conductor lines 110A through 110D extend in a rectangular loop shape.

In such a branch line coupler 110, the length of the route passing through the conductor lines 110A, 110B, and 110C between the terminal 111 and the terminal 114 differs by $\lambda e_1/2$ from the length of the route passing through only the conductor line 110D. With this arrangement, a signal passing through the conductor lines 110A, 110B, and 110C and a signal passing through only the conductor line 110D arrive at the terminal 114 in the state in which these signals have a 180-degree phase difference.

A signal having a frequency band that includes a frequency-f1 band may be applied to the terminal 111 while the balun circuits 120A and 120B are not connected to the terminals 112 and 113, respectively. In such a case, a signal having the frequency band (hereinafter referred to as "the frequency-f1 band") that includes the frequency f1 and frequencies which are adjacent to the frequency f1 and which have the frequency f1 at the center is canceled by the route passing through the conductor lines 110A, 110B, and 110C and the route passing through the conductor line 110D. As a result, a signal in which the signal level of the frequency-f1 band is reduced in the frequency band of the input signal is output from the terminal 114. Namely, the branch line coupler 110 reduces the transmission of a signal in a frequency band around the designed frequency f1.

[Configuration and Operation of Balun Circuit 120]

The balun circuit 120 has an input terminal 120IN and transmission lines 121, 122, 123, and 124 as illustrated in FIG. 2. The input terminal 120IN is an example of the first input terminal. The transmission lines 121, 122, 123, and 124 are examples of the first transmission line, the second transmission line, the third transmission line, and the fourth transmission line, respectively. The balun circuit 120, which is a chip formed by using a GaAs (gallium arsenide) substrate, for example, is flip-chip mounted on the surface of the substrate 10. The interior of the balun circuits 120A and 120B in FIG. 1 represents the mutual connection of the transmission lines 121, 122, 123, and 124 within the chip, and is not intended to represent the direction in the XYZ coordinate system in which the transmission lines 121, 122, 123, and 124 extend.

The balun circuit 120 is a circuit which reduces the reflection of a signal having the frequency f0 of interest included in the frequency band of the signal applied to the input terminal 120IN. In other words, the balun circuit 120 is a circuit which absorbs a signal having the frequency f0 of interest included in the frequency band of the signal applied to the input terminal 120IN. Because of this, the balun circuit 120 may be viewed as a reflection reduction circuit or an absorption circuit.

Each of the transmission lines 121 through 124 has a length comparable to ¼ of an electrical length $\lambda e_0$ of one wavelength at the frequency f0 of interest. Here, the length comparable to ¼ of the electrical length $\lambda e_0$ is intended to include not only $\lambda e_0/4$ but also a length slightly shorter than $\lambda e_0/4$ or a length slightly longer than $\lambda e_0/4$ in consideration of impedance matching and the like. The lengths of the transmission lines 121 through 124 are identical as an example.

The line widths of the transmission lines 121 through 124 may be set to appropriate widths by taking into consideration their impedances and the like. It is nonetheless preferable, from the viewpoint of circuit symmetry, that the line widths of the transmission lines 121 and 124 are equal and that the line widths of the transmission lines 122 and 123 are equal. Here, as an example, the line widths of transmission lines 121 through 124 are all equal.

The transmission lines 121 and 124 among the transmission lines 121 through 124 extend parallel to each other. The transmission line 121 has one end connected to the input terminal 120IN and the other end connected to GND (i.e., the ground). The transmission line 122 has one end connected to the input terminal 120IN and the other end connected to one end of the transmission line 123. The transmission line 122 is situated alongside the transmission line 121.

The transmission line 123 is situated alongside the transmission line 124, and has the other end thereof connected to one end of the transmission line 124. The transmission line 124 is situated alongside the transmission line 121 in such proximity as to ensure an electromagnetic coupling of proper strength with the transmission line 121 while extending parallel to the transmission line 121. The other end of the transmission line 124 is connected to GND (i.e., the ground).

The transmission line 124 is connected to input terminal via the transmission lines 122 and 123. Since the length of the transmission lines 122 and 123 is $\lambda e_0/2$, signals having a 180-degree phase difference at the frequency f0 of interest appear at the noted one end of the transmission line 121 and the noted one end of the transmission line 124, respectively. As is illustrated in FIG. 2, the signal at the one end of the transmission line 121 may be 0 degrees, and, in that case, the phase of the signal at the one end of the transmission line 124 is 180 degrees.

With this arrangement, the transmission lines 121 and 124 transmit signals whose phases differ by 180 degrees from each other. Since the transmission lines 121 and 124 are situated in such proximity as to ensure an electromagnetic coupling of substantial strength, the signals transmitted through the transmission lines 121 and 124 are synthesized. Synthesizing the signals having a 180-degree phase difference causes the signals transmitted through the transmission lines 121 and 124 to cancel each other.

A signal at the frequency f0 of interest is thus not reflected at the input terminal 120IN. To be more specific, the signal level of the signal having the frequency f0 of interest and reflected at the input terminal 120IN is extremely low, which achieves reduced reflection substantially equivalent to no reflection. In other words, the signal having the frequency f0 of interest included in the signal applied to the input terminal 120IN is absorbed by the balun circuit 120, and is not output from the input terminal 120IN.

It follows that, when the impedance of the balun circuit 120 as viewed from the input terminal 120IN is 50 Ω as an example, it is proper to regard the balun circuit 120 as being substantially identical to a 50-Ω terminating resistor for the signal having the frequency f0 of interest. The fact that the transmission lines 121 and 124 are situated in proximity means that the electromagnetic coupling is so strong as to cause the signals transmitted through transmission lines 121 and 124 to be synthesized. The illustration herein is directed to a circuit configuration in which the noted other ends of the transmission lines 121 and 124 are both connected to, and terminated at, GND (i.e., the ground). Alternatively, the noted other ends of the transmission lines 121 and 124 may both be open-circuited (open), or may be connected to two respective terminating resistors whose resistance values are equal to each other. In other words, it suffices for the noted other ends of the transmission lines 121 and 124 to be terminated in the same condition. As an example, it suffices for these ends to be both connected to GND, or be both open-circuited, or be connected to two respective terminating resistors whose resistance values are equal to each other.

Further, the reason why the circuit illustrated in FIG. 2 is referred to as the balun circuit 120 is as follows. When the signal at one end (the end in the positive X direction) of the transmission line 121 is set to 0 degrees, the phase of the signal at one end (the end in the positive X direction) of the transmission line 124 becomes 180 degrees. The circuit is thus internally generating a signal having a 0-degree phase and a signal having a 180-degree phase, and, from this viewpoint, the circuit can be interpreted as a general balun circuit. The balun circuit 120 of the present embodiment that has the configuration illustrated in FIG. 2 and the features described above will suffice, and need not necessarily have the properties required for a general balun.

[S11 Parameter of Balun Circuit 120]

Figure 3:
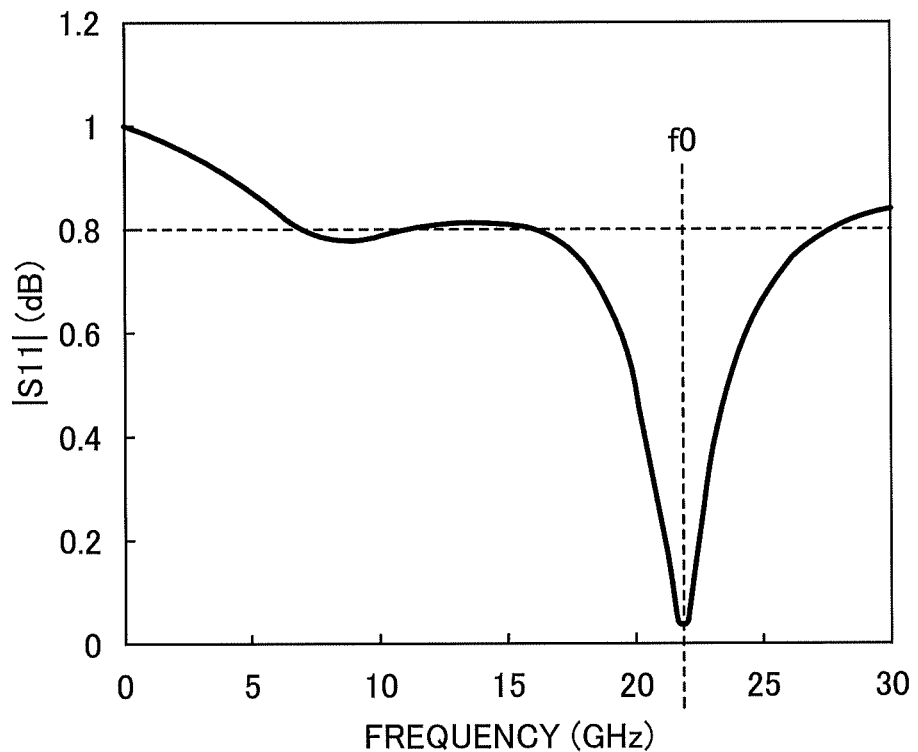
FIG. 3 is a drawing illustrating the frequency characteristics of the S11 parameter of the balun circuit.

FIG. 3 is a drawing illustrating the frequency characteristics of the S11 parameter (i.e., reflection coefficient) of the balun circuit 120. The frequency characteristics of the S11 parameter are calculated by assigning the input terminal 120IN to port 1 in a circuit simulator. In FIG. 3, the horizontal axis represents the frequency (GHz), and the vertical axis represents the S11 parameter (dB). As an example, herein, the frequency f0 of interest is 22 GHz.

As illustrated in FIG. 3, the obtained characteristics were such that the value of the S11 parameter became extremely small in a frequency band centered at the frequency f0 of interest. The value of the S11 parameter at the frequency f0 of interest was about 0.05 dB, and the satisfactory values that were less than or equal to 0.8 dB were obtained over a wide frequency band from about 17 GHz to about 28 GHz. It was confirmed, based on the simulation results illustrated in FIG. 3, that the balun circuit 120 is able to reduce the reflection of a signal having the frequency f0 of interest.

[Functional Characteristics of Filter Circuit 100]

Figure 4:
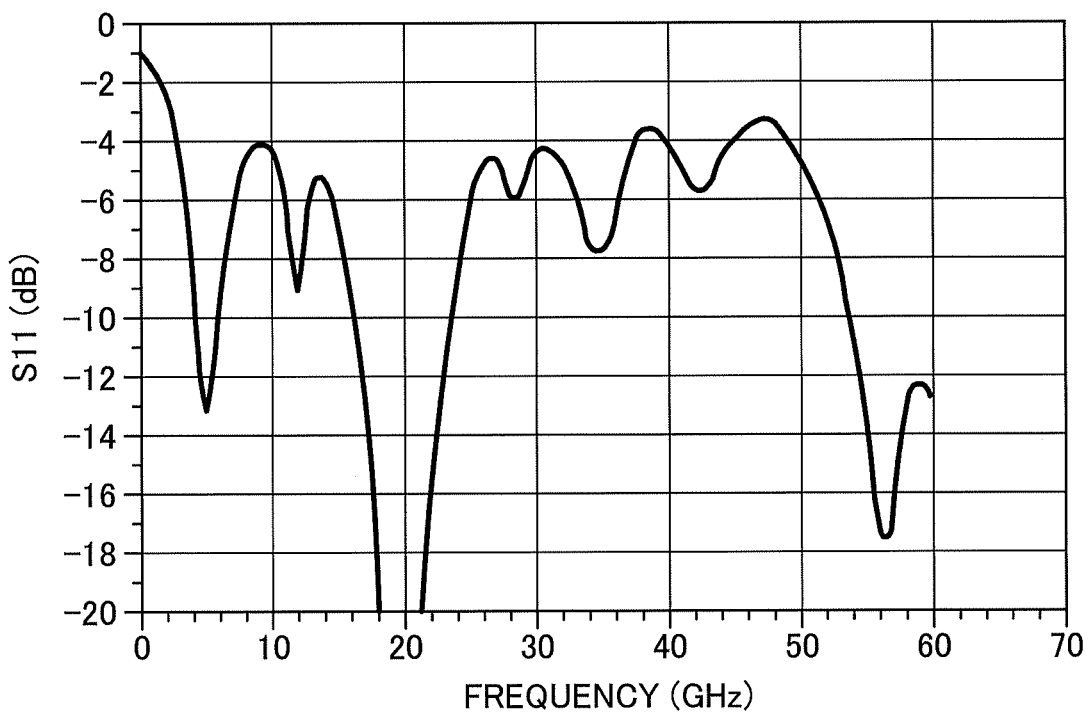
FIG. 4 is a drawing illustrating the functional characteristics of the filter circuit.
Figure 5:
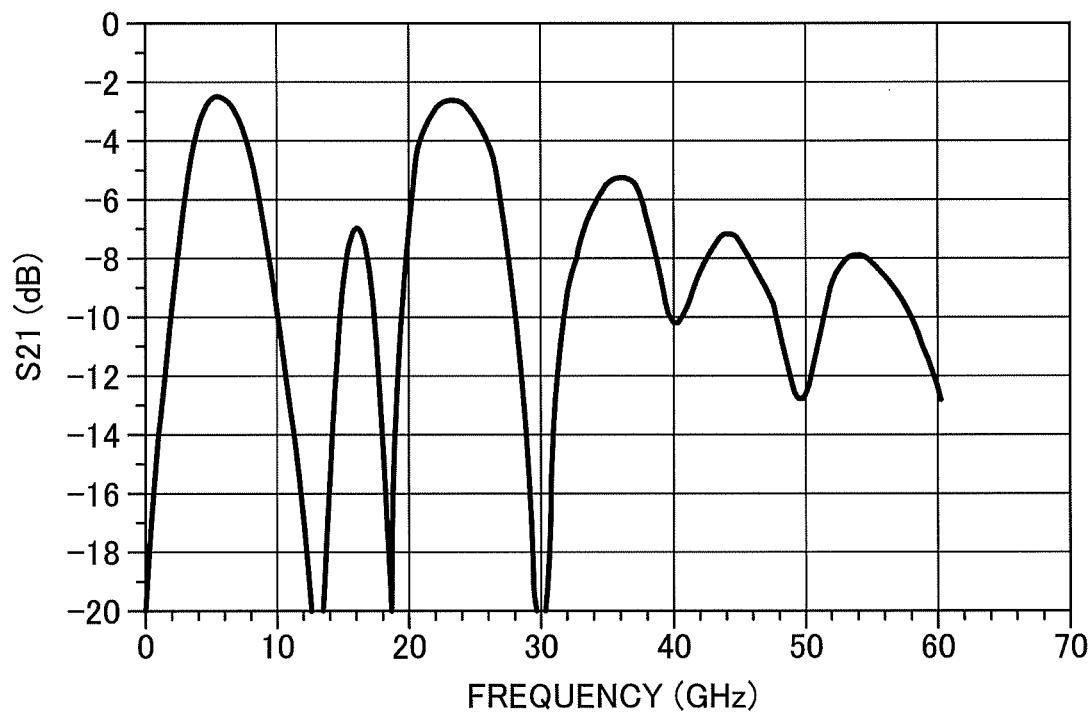
FIG. 5 is a drawing illustrating the functional characteristics of the filter circuit.

FIG. 4 and FIG. 5 are drawings illustrating the functional characteristics of the filter circuit 100. FIG. 4 illustrates the frequency characteristics of the S11 parameter, and FIG. 5 illustrates the frequency characteristics of the S21 parameter. A description herein will be given with respect to a case in which the length of each of the conductor lines 110A through 110D of the branch line coupler 110 and the length of each of the transmission lines 121 through 124 of the balun circuits 120A and 120B are set as follows. Each of the conductor lines 110A through 110D has a length comparable to ¼ of the electrical length $\lambda e_1$ when frequency f1 is 15 GHz. Each of the transmission lines 121 through 124 has a length comparable to ¼ of the electrical length $\lambda e_0$ when the frequency f0 of interest is 20 GHz.

The S11 parameter of the filter circuit 100 was calculated by the circuit simulator by assigning the terminal 111 of the branch line coupler 110 to port 1. The S21 parameter of the filter circuit 100 was calculated by the circuit simulator by assigning the terminal 111 of the branch line coupler 110 to port 1 and assigning the terminal 114 to port 2.

As illustrated in FIG. 4, the obtained characteristics were such that the S11 parameter was less than −20 dB in the frequency band from about 18 GHz to about 22 GHz and less than −10 dB in the frequency band from about 16 GHz to about 25 GHz, which indicated that reflection was reduced around 20 GHz. As illustrated in FIG. 5, the obtained characteristics were such that the S21 parameter was less than −10 dB, indicating the reduction of transmission, in the frequency band from about 11 GHz to about 16 GHz, the frequency band from about 18 GHz to about 20 GHz, and the frequency band from about 28 GHz to about 30 GHz.

As was previously described, the frequency f0 of interest with respect to the balun circuits 120A and 120B was set to 20 GHz, and the frequency f1 of the branch line coupler 110 was set to 15 GHz. It is thus conceivable that the decrease in the value of the S11 parameter around 20 GHz was caused by the fact that the band components around 20 GHz of signals transmitted through the branch line coupler 110 were absorbed into the balun circuits 120A and 120B due to the reduction of reflection at the input terminal 120IN of the balun circuits 120A and 120B. It may thus be the case that, as a result, the value of the S21 parameter was decreased around 20 GHz, and the frequency band around 20 GHz was not transmitted when signals were transmitted from the terminal 111 to the terminal 114 of the branch line coupler 110.

Further, it may be the case that the lowering of the value of the S21 parameter in a frequency range around 15 GHz was due to the fact that this frequency range was around the frequency f1 of the branch line coupler 110, and, thus, the signals canceled each other between the route passing through the conductor lines 110A, 110B, and 110C and the route passing through the conductor line 110D. Further, it may be the case that the lowering of the value of the S21 parameter in a frequency band around 30 GHz was due to the fact that this frequency band was around the second harmonic of the frequency f1 of the branch line coupler 110, and, thus, the signals canceled each other between the route passing through the conductor lines 110A, 110B, and 110C and the route passing through the conductor line 110D.

As described above, it was confirmed that connecting the balun circuits 120A and 120B to the respective terminals 112 and 113 of the branch line coupler 110 causes a frequency band around 20 GHz to be removed from the signals transmitted through the branch line coupler 110. This is because the balun circuits 120A and 120B reduce the reflection of signals in a frequency band around the frequency f0 of interest at the input terminal 120IN, so that the balun circuits 120 absorb the signals in the frequency band around the frequency f0 of interest, thereby reducing both the reflection of signals and the transmission of signals in the frequency band around the frequency f0 of interest at the branch line coupler 110.

The filter circuit 100 and the balun circuits 120 capable of reducing signal reflection with respect to the frequency of interest are thus provided. Further, the filter circuit 100 and the balun circuits 120 capable of reducing signal transmission with respect to the frequency of interest are provided. Adjusting the frequency f0 of interest by determining the length of the transmission lines 121 through 124 of the balun circuit 120 allows the frequency f0 of interest to be removed from the signals transmitted through the branch line coupler 110.

Further, it may be desired to divide the frequency band of signals transmitted through the branch line coupler 110, which may be achieved by including the frequency f0 of interest in the frequency band that is not transmitted as a result of division. This arrangement allows the frequency band of signals transmitted through the branch line coupler 110 to be divided at the frequency band around the frequency f0 of interest. This arrangement is best suited to the application in which interference between adjacent frequency bands need to be reduced.

Further, the two balun circuits 120A and 120B are connected to the respective terminals 112 and 113 of the branch line coupler 110 with a symmetrical circuit configuration, so that the circuit as a whole has an excellent balance. The two balun circuits 120A and 120B remove the frequency f0 of interest from signals transmitted through the branch line coupler 110, thereby more effectively reducing the reflection of a signal at the frequency f0 of interest.

The rectangular loop shape of the conductor lines 110A through 110D of the branch line coupler 110 allows the line length and the line width to be easily set, and also allows the impedance of the branch line coupler 110 to be easily set.

Provision of the transmission lines 121 through 124 having the same length in the balun circuit 120 causes a reflection coefficient to be more effectively reduced in the frequency band around the frequency f0 of interest at which the length of the transmission lines 121 through 124 becomes equal to a quarter wavelength, which enables removal thereof from the radio-frequency signals transmitted through the conductor lines 110A through 110D of the branch line coupler 110.

Further, arranging the transmission lines 121 and 124 in parallel to, and in proximity of, each other in the balun circuit 120 ensures the occurrence of stronger electromagnetic coupling to cause signals transmitted through transmission lines 121 and 124 to be synthesized. As a result, a reflection coefficient is more effectively reduced in the frequency band around the frequency f0 of interest at which the length of the transmission lines 121 through 124 becomes equal to a quarter wavelength, which enables removal thereof from the radio-frequency signals transmitted through the conductor lines 110A through 1110D of the branch line coupler 110.

It should be noted that although the configuration in which the balun circuit 120 is connected to the branch line coupler 110 to construct the filter circuit 100 has been described, the balun circuit 120 may be connected to a circuit other than the branch line coupler 110. Namely, the use of the balun circuit 120 is not limited to the filter circuit 100. Connecting the balun circuit 120 to a circuit other than the branch line coupler 110 enables the absorption of signals at a frequency band around the frequency f0 of interest in the connected circuit. Absorbing signals in the frequency band around the frequency f0 of interest is tantamount to reducing the reflection of a signal at the frequency f0 of interest to the outside of the balun circuit 120.

Although the above description has been directed to the case in which the balun circuits 120A and 120B are connected to the respective terminals 112 and 113 of the branch line coupler 110, the filter circuit 100 may be implemented as having one balun circuit 120.

[Configuration of Filter Circuits 100A and 100B)

Figure 6:
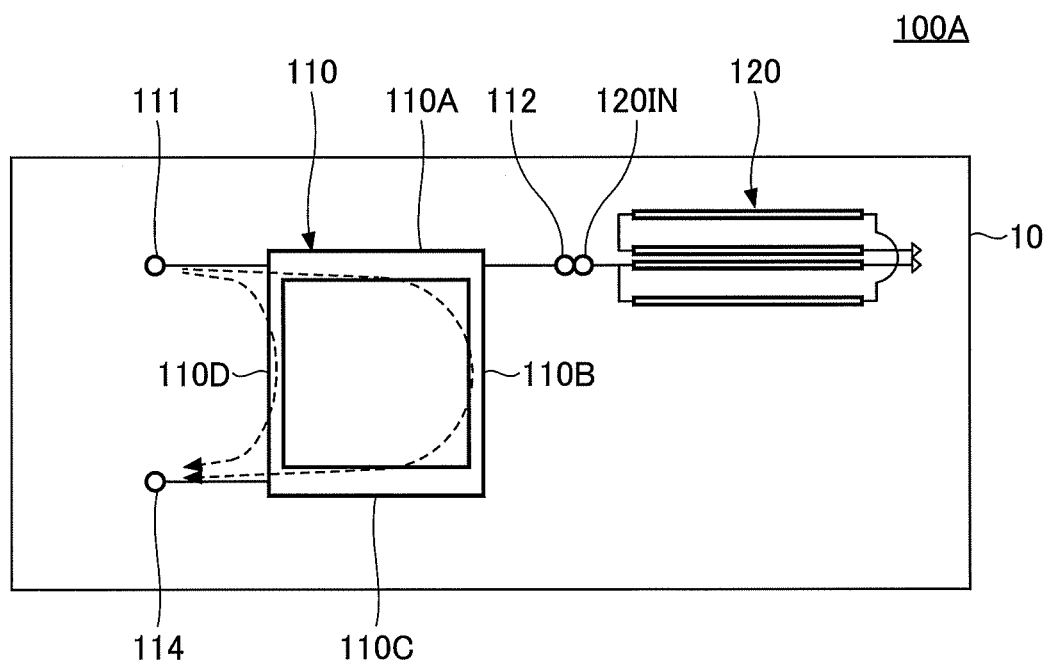
FIG. 6 is a drawing illustrating a filter circuit according to a variation of the embodiment.
Figure 7:
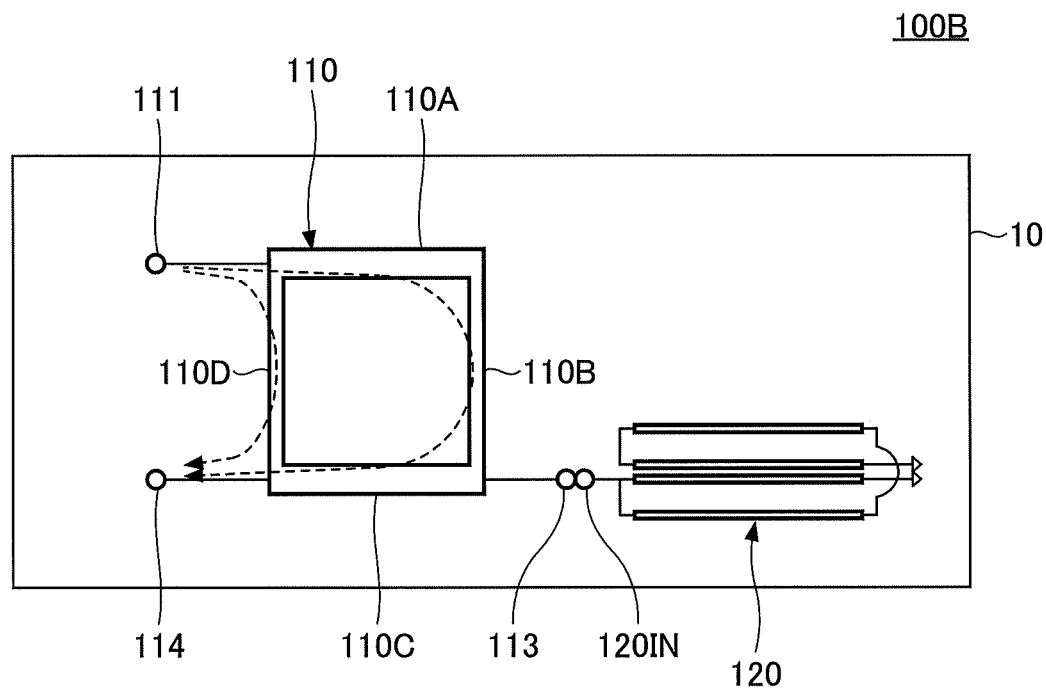
FIG. 7 is a drawing illustrating a filter circuit according to a variation of the embodiment.

FIG. 6 and FIG. 7 are drawings illustrating a filter circuit 100A and a filter circuit 100B, respectively, according to a variation of the embodiment. As illustrated in FIG. 6, the filter circuit 100A may be such that the balun circuit 120 is connected to the terminal 112 of the branch line coupler 110, for example. As illustrated in FIG. 7, the filter circuit 100B may be such that the balun circuit 120 is connected to the terminal 113 of the branch line coupler 110. In such filter circuits 100A and 100B also, the balun circuit 120 absorbs signals in the frequency band around the frequencies f0 of interest among the signals transmitted through the branch line coupler 110. The filter circuits 100A and 100B capable of reducing signal reflection with respect to frequencies of interest is thus provided.

[Frequency Characteristics of Balun Circuit 120M]

Figure 8:
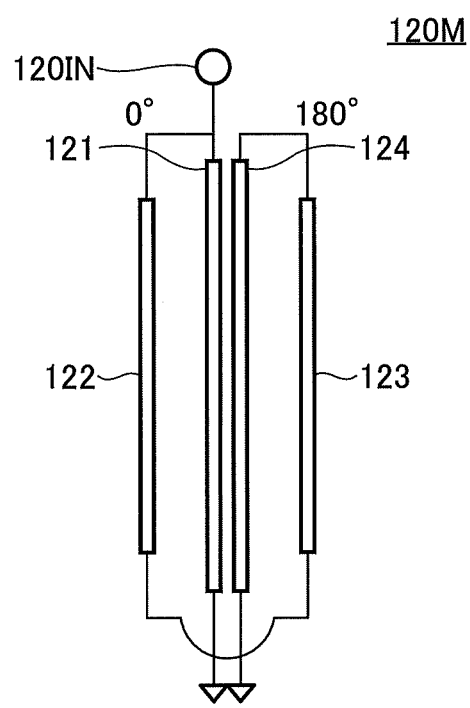
FIG. 8 is a drawing illustrating a balun circuit according to a variation of the embodiment.

Although the above description has been directed to the configuration in which the lengths of the transmission lines 121 through 124 of the balun circuit 120 are equal to each other, these lengths may be different. FIG. 8 is a drawing illustrating a balun circuit 120M according to a variation of the embodiment. The balun circuit 120M differs from the balun circuit 120 illustrated in FIG. 2 in that the lengths of the transmission lines 121 and 124 are longer than the lengths of the transmission lines 122 and 123. It may be noted that the lengths of transmission lines 121 and 124 are equal to each other, and the lengths of transmission lines 122 and 123 are equal to each other.

Figure 9:
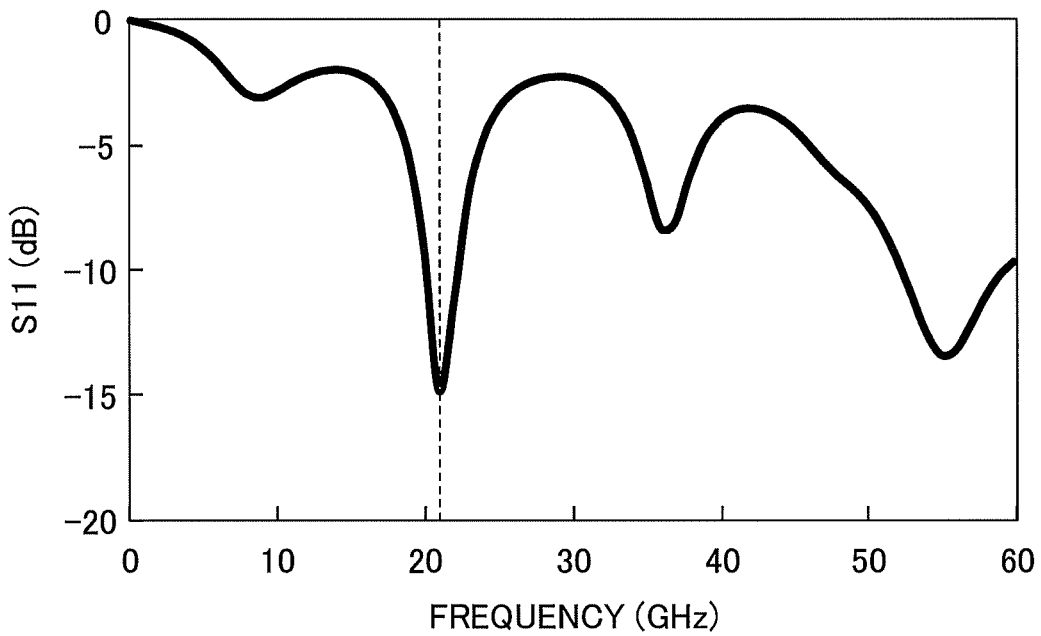
FIG. 9 is a drawing illustrating the frequency characteristics of the S11 parameter of the balun circuit.
Figure 10:
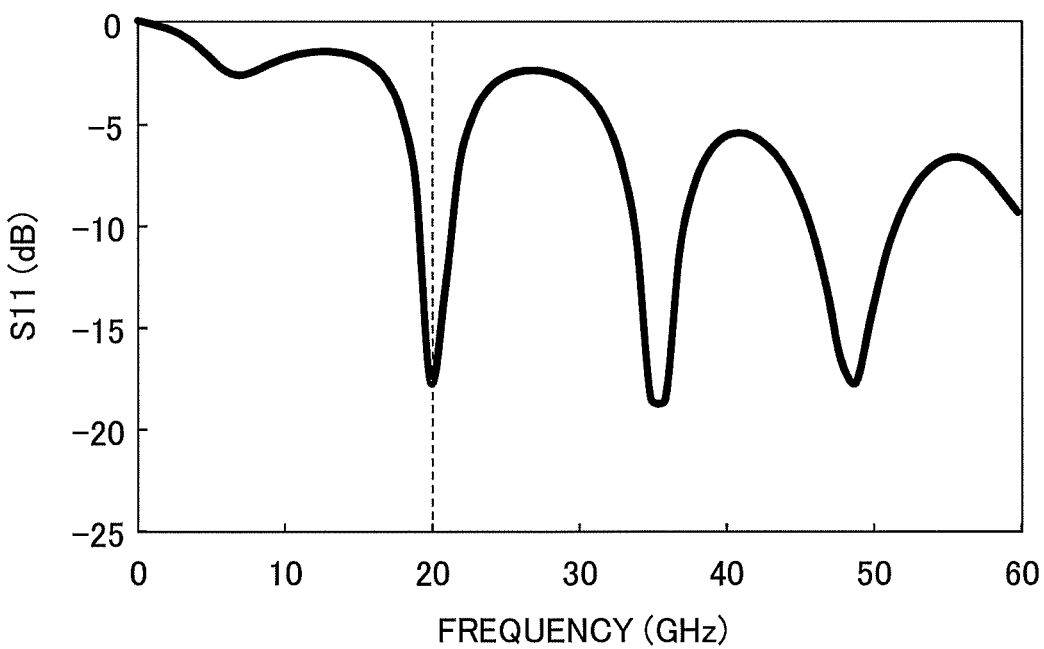
FIG. 10 is a drawing illustrating the frequency characteristics of the S11 parameter of the balun circuit.

FIG. 9 is a drawing illustrating the frequency characteristics of the S11 parameter of the balun circuit 120M. FIG. 10 is a drawing illustrating the frequency characteristics of the S11 parameter of the balun circuit 120M. FIG. 9 illustrates the frequency characteristics of the S11 parameter calculated by a circuit simulator upon setting the length of the transmission lines 121 and 124 to a length comparable to ¼ of an electrical length of one wavelength at 20 GHz and setting the length of the transmission lines 122 and 123 to a length comparable to ¼ of an electrical length of one wavelength at 26 GHz, for example. FIG. 10 illustrates the frequency characteristics of the S11 parameter calculated by a circuit simulator upon setting the length of the transmission lines 121 through 124 to a length comparable to ¼ of an electrical length of one wavelength at 20 GHz, for example.

Comparing FIG. 9 with FIG. 10 reveals that, in FIG. 9, the frequency providing the minimum value of the S11 parameter is shifted to about 22 GHz, and the frequency band in which the value of the S11 parameter is −10 dB or less is slightly widened. The configuration of the balun circuit 120M in which the length of the transmission lines 121 and 124 is longer than the length of the transmission lines 122 and 123 is achieved by shortening the transmission lines 122 and 123 in comparison with the balun circuit 120.

It is conceivable that, in the balun circuit 120M, the transmission loss occurring on the transmission lines 122 and 123 is shifted to the higher frequency side by 3 GHz, which serves to achieve the widening of bandwidth and to shift the frequency providing the minimum value of the S11 parameter. As described above, use of the configuration in which the length of the transmission lines 121 and 124 is longer than the length of the transmission lines 122 and 123 serves to provide a balun circuit 120M in which the frequency band having reduced reflection is widened. Use of such a balun circuit 120M in place of the balun circuits 120A and 120B of FIG. 1 is believed to widen the frequency band having reduced transmission around 22 GHz among the signals output from the terminals 114 of the branch line coupler 110.

[Configuration of Filter Circuit 100C]

Figure 11:
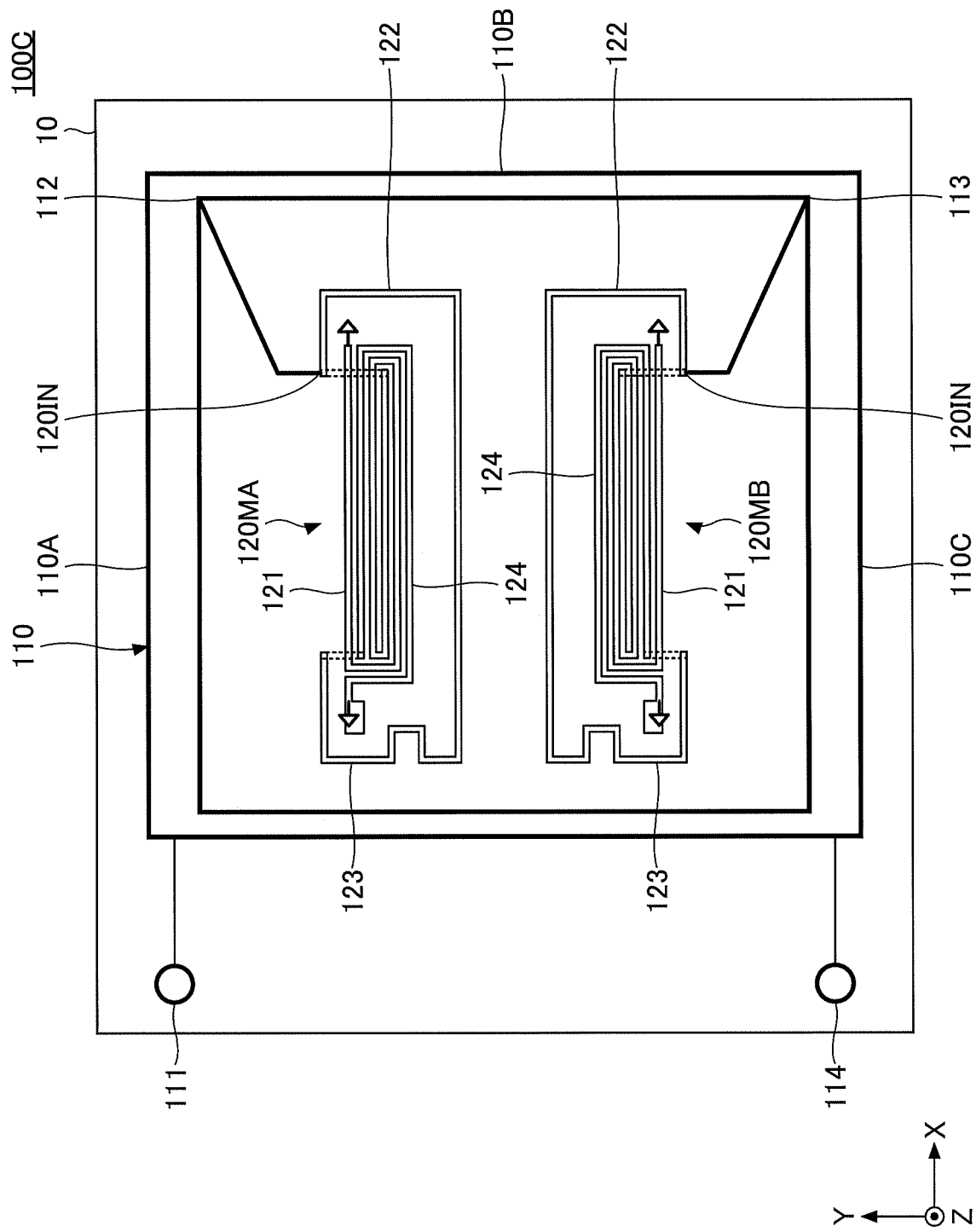
FIG. 11 is a drawing illustrating a filter circuit according to a variation of the embodiment.

Although the above description has been directed to the configuration in which the balun circuits 120A and 120B are disposed outside the branch line coupler 110, the balun circuits 120A and 120B may alternatively be disposed inside the branch line coupler 110. FIG. 11 is a drawing illustrating a filter circuit 100C according to a variation of the embodiment.

The filter circuit 100C includes a substrate 10, a branch line coupler 110, and balun circuits 120MA and 120MB. The balun circuits 120MA and 120MB are disposed on the upper surface of the substrate 10 inside a rectangular area enclosed by the conductor lines 110A through 110D of the branch line coupler 110.

The input terminals 120IN of the balun circuits 120MA and 120MB are connected to the terminals 112 and 113, respectively. The circuit configurations of the balun circuits 120MA and 120MB are identical, and a description in the following will be given with respect to the balun circuit 120MA.

The mutual connection and lengths of the transmission lines 121 through 124 of the balun circuit 120MA are substantially the same as those of the transmission lines 121 through 124 of the balun circuit 120A illustrated in FIG. 2. For the purpose of size reduction, however, the transmission lines 121 through 124 are bent in the balun circuit 120MA. The transmission line 121 extends in a rectangular spiral at the center of the balun circuit 120MA. The transmission lines 122 and 123 extend along the respective sides of the balun circuit 120MA. The transmission line 124 extends in a rectangular spiral alongside the transmission line 121. The portions illustrated in dotted lines are the portions of the transmission lines 121 and 124 which intersect each other, and are disposed in the inner layer of the chip of the balun circuit 120MA.

Arranging the size-reduced balun circuits 120MA and 120MB inside the rectangular area enclosed by the conductor lines 110A through 110D of the branch line coupler 110 enables the provision of the size-reduced filter circuit 100C in addition to the reduction of signal reflection at the frequencies of interest.

[Configuration of Filter Circuit 100D]

Figure 12:
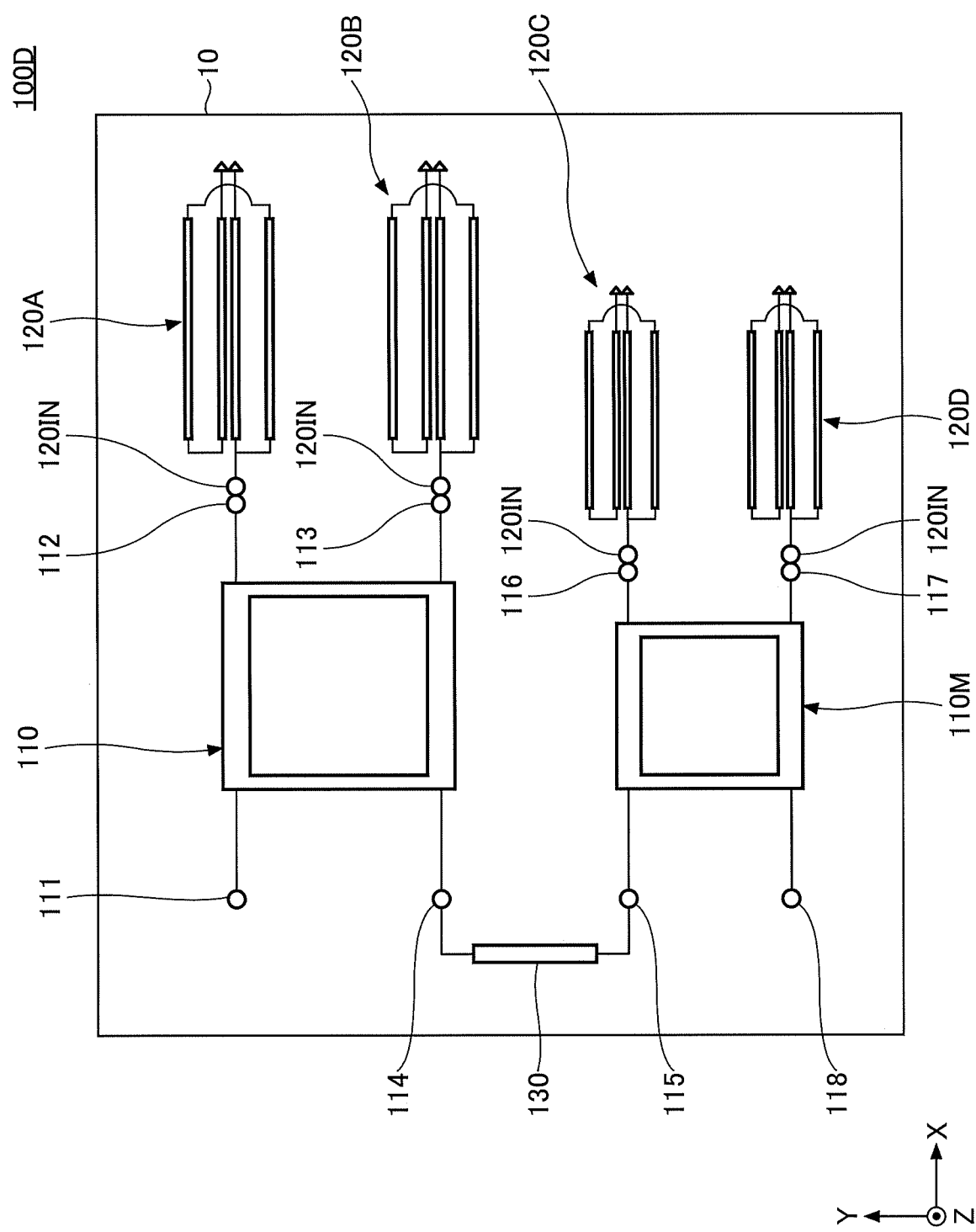
FIG. 12 is a drawing illustrating a filter circuit according to a variation of the embodiment.

FIG. 12 is a drawing illustrating a filter circuit 100D according to a variation of the embodiment. The filter circuit 100D includes a substrate 10, branch line couplers 110 and 110M, balun circuits 120A, 120B, 120C, and 120S, and a line 130. The branch line coupler 110 and the balun circuits 120A and 120B are substantially the same as those illustrated in FIG. 1. The branch line coupler 110M has terminals 115, 116, 117, 118 and four conductor lines (for which reference numerals are omitted in FIG. 12) similar to the conductor lines 110A through 110D of the branch line coupler 110. The balun circuits 120C and 120D have four transmission lines (for which reference numerals are omitted in FIG. 12) similar to the transmission lines 121 through 124 of the balun circuits 120A and 120B.

The branch line coupler 110 is an example of a first branch line coupler, and the branch line coupler 110M is an example of a second branch line coupler. The four conductor lines of the branch line coupler 110M are an example of second conductor lines. The terminals 115, 116, 117, and 118 are an example of a fifth terminal, a sixth terminal, a seventh terminal, and an eighth terminal, respectively. The balun circuits 120A and 120B are an example of a first balun circuit, and the balun circuits 120C and 120D are an example of a second balun circuit. The four transmission lines of each of the balun circuits 120C and 120D are an example of the fifth transmission line, the sixth transmission line, the seventh transmission line, and the eighth transmission line, respectively.

The terminal 115 of the branch line coupler 110M is connected to the terminal 114 of the branch line coupler 110 via the line 130. The input terminals 120IN of the balun circuits 120C and 120D are connected to the respective terminals 116 and 117. The line 130 is a micro-strip line as an example.

The branch line coupler 110M is different in size from the branch line coupler 110. The branch line coupler 110M is smaller than the branch line couplers 110, and has a design frequency f2 that is higher than the design frequency f1 of the branch line coupler 110. The balun circuits 120C and 120D are different in size from the balun circuits 120A and 120B. The lengths of the four transmission lines of the balun circuits 120C and 120D are shorter than the lengths of the transmission lines 121 through 124 of the balun circuits 120A and 120B. It follows that a frequency f3 of interest of the balun circuits 120C and 120D is higher than the frequency f0 of interest of the balun circuits 120A and 120B.

In such a filter circuit 100D, signals in a frequency band around the frequency f0 of interest among the signals input into the branch line coupler 110 are absorbed by the balun circuits 120A and 120B, and signals in a frequency band around the frequency f1 are canceled in the branch line coupler 110. Among signals input into the branch line coupler 110M from the branch line coupler 110 via the line 130, signals in a frequency band around the frequency f3 of interest are absorbed by the balun circuits 120C and 120D, and signals in a frequency band around the frequency f2 are canceled in the branch line coupler 110M. As a result, the terminal 118 of the branch line coupler 110M outputs signals that remain after removing signals in the frequency bands around the frequencies f0, f1, f2, and f3 from the signals input into the branch line coupler 110.

Radio-frequency signals may be divided into five frequency bands by setting the frequencies f0, f1, f2, and f3 based on the two branch line couplers 110 and 110M and the balun circuits 120A, 120B, 120C, and 120D connected to the branch line couplers 110 and 110M.

The branch line couplers 110 and 110M differ in size, and the balun circuits 120A and 120B have a different size than the balun circuits 120C and 120D. With this arrangement, a reflection coefficient is reduced at the frequency that is included in the radio-frequency signals transmitted through the branch line coupler 110 and that corresponds to the balun circuits 120A and 120B, and a reflection coefficient is reduced at the frequency that is included in the radio-frequency signals transmitted through the branch line coupler 110M and that corresponds to the balun circuits 120C and 120D. The filter circuit 100D is thus provided that is capable of reducing signal reflection in the two branch line couplers 110 and 110M with respect to respective, different frequencies of interest.

The filter circuit 100D is configured such that the small branch line coupler 110M is connected downstream to the large branch line coupler 110. This order may be reversed. In the following, a description will be given of the results of simulation performed upon constructing a first simulation model in which the lengths of respective parts in the filter circuit 100D were set as follows. The length of the conductor lines 110A through 110D of the branch line coupler 110 was set to a length comparable to ¼ of an electrical length of one wavelength at 27 GHz. In the balun circuits 120A and 120B, the length of the transmission lines 121 and 124 was set to a length comparable to ¼ of an electrical length of one wavelength at 16.5 GHz, and the length of the transmission lines 122 and 123 was set to a length comparable to ¼ of an electrical length of one wavelength at 30 GHz. The length of the four conductor lines of the branch line coupler 110M was set to a length comparable to ¼ of an electrical length of one wavelength at 25 GHz. In the balun circuits 120A and 120B, the length of the transmission lines 121 and 124 was set to a length comparable to ¼ of an electrical length of one wavelength at 14 GHz, and the length of the transmission lines 122 and 123 was set to a length comparable to ¼ of an electrical length of one wavelength at 26 GHz. Further, in order to balance the overall impedance, a 0.18-pF capacitor was inserted in series between the terminal 114 and the line 130 and also between the line 130 and the terminal 115.

[Frequency Characteristics of S11 and S21 Parameters of First Simulation Model]

Figure 13:
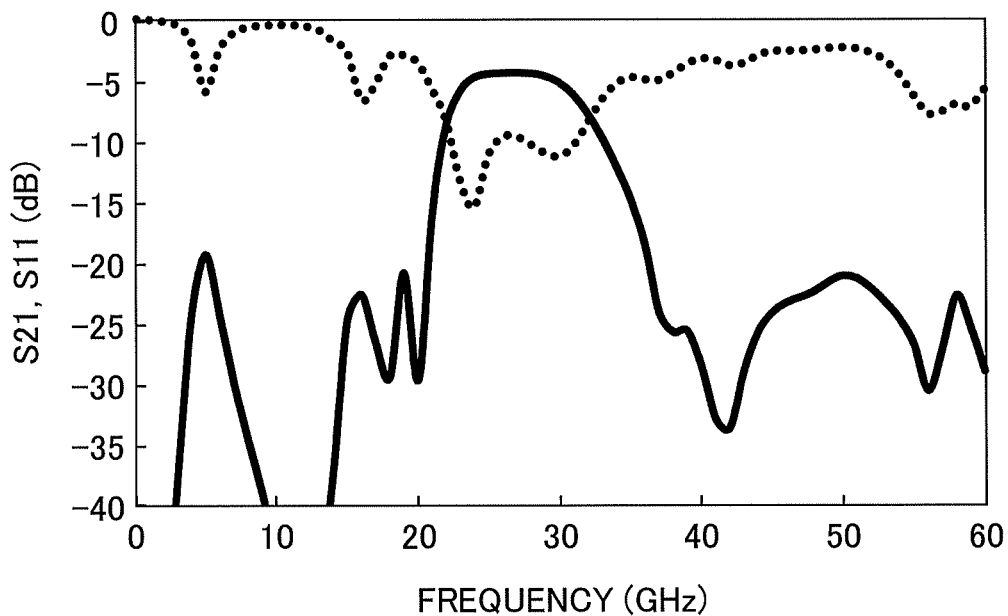
FIG. 13 is a drawing illustrating the frequency characteristics of the S11 and S21 parameters of a first simulation model.

FIG. 13 is a drawing illustrating the frequency characteristics of the S11 and S21 parameters of the first simulation model. In FIG. 13, the dotted line illustrates the frequency characteristics of the S11 parameter, and the solid line illustrates the frequency characteristics of the S21 parameter.

As is observed, the S11 parameter was reduced to less than or equal to −10 dB in the frequency band from about 24 GHz to about 27 GHz and the frequency band from about 29 GHz to about 34 GHz. As is further observed, the S21 parameter was −10 dB or less over a wide range. Even when compared with a −20 dB threshold, only the frequency band from about 24 GHz to about 35 GHz was allowed to pass. The above observation confirms that the first simulation model including the two branch line couplers 110 and 110M and the four balun circuits 120A through 120D enables the reduction of reflection in a frequency band of interest, and also enables the transmission of signals in a frequency band of interest.

[Frequency Characteristics of S11 and S21 Parameters of Second Simulation Model]

In addition, the frequency characteristics of the S11 and S21 parameters were also calculated with respect to a second simulation model that had two first simulation models as described above connected in series. The series connection means that the terminal 118 of the first simulation model at the first stage is connected to the terminal 111 of the first simulation model at the second stage. The S11 parameter was calculated by using the terminal 111 of the first simulation model at the first stage as port 1. The S21 parameter was calculated by using the terminal 111 of the first simulation model at the first stage as port 1 and the terminal 118 of the first simulation model at the second stage as port 2.

Figure 14:
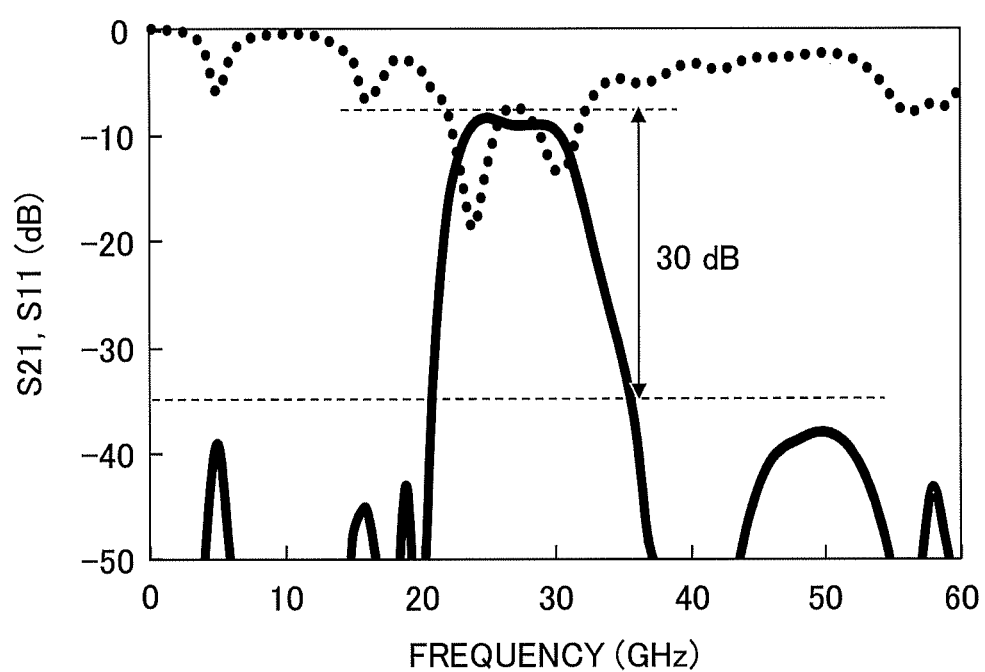
FIG. 14 is a drawing illustrating the frequency characteristics of the S11 and S21 parameters of a second simulation model.

FIG. 14 is a drawing illustrating the frequency characteristics of the S11 and S21 parameters of the second simulation model. In FIG. 14, the dotted line illustrates the frequency characteristics of the S11 parameter, and the solid line illustrates the frequency characteristics of the S21 parameter. In comparison with the first simulation model, especially the S21 parameter in the second simulation model was improved, with a difference of about 30 dB between the frequency band from about 24 GHz to about 35 GHz and other peaks. The above observation confirms that the second simulation model including the two branch line couplers 110 and 110M and the four balun circuits 120A through 120D enables the reduction of reflection in a frequency band of interest, and also enables the transmission of signals in a frequency band of interest.

The descriptions of the filter circuits and balun circuits of exemplary embodiments have been provided heretofore. The present invention is not limited to these embodiments, but various variations and modifications may be made without departing from the scope of the present invention.

Further, the present invention is not limited to these embodiments, but various variations and modifications may be made without departing from the scope of the present invention.

What is claimed is:

1. A filter circuit comprising:
a first branch line coupler having a first terminal, a second terminal, a third terminal, and a fourth terminal which are connected together in this order through a first conductor line forming a loop, the first terminal serving as a first input port, and the fourth terminal serving as a first output port; and
a first balun circuit connected to one of the second terminal and the third terminal, wherein the first balun circuit includes:
a first input terminal connected to the one of the second terminal and the third terminal to receive a radio-frequency signal;
a first transmission line having one end connected to the first input terminal and having a length comparable to a quarter of a first electrical length of one wavelength at a frequency of the radio-frequency signal;
a second transmission line having one end connected to the first input terminal and having a length comparable to a quarter of the first electrical length;
a third transmission line having one end connected to another end of the second transmission line and having a length comparable to a quarter of the first electrical length; and
a fourth transmission line having one end connected to another end of the third transmission line and electromagnetically coupled to the first transmission line, the fourth transmission line having a length comparable to a quarter of the first electrical length,
wherein another end of the first transmission line and another end of the fourth transmission line are both connected to a ground, or are both open-circuited, or are connected to two respective terminating resistors whose resistance values are equal to each other, and
wherein the first balun circuit is disposed inside an area enclosed by the first conductor line.

2. The filter circuit as claimed in claim 1, wherein the first branch line coupler is configured such that the first terminal, the second terminal, the third terminal, and the fourth terminal are connected in this order through the first conductor line having a rectangular loop shape.

3. The filter circuit as claimed in claim 1, further comprising a second balun circuit connected to another one of the second terminal and the third terminal,
wherein the second balun circuit includes:
a second input terminal connected to the another one of the second terminal and the third terminal to receive the radio-frequency signal;
a fifth transmission line having one end connected to the second input terminal and having a length comparable to a quarter of the first electrical length;
a sixth transmission line having one end connected to the second input terminal and having a length comparable to a quarter of the first electrical length;
a seventh transmission line having one end connected to another end of the sixth transmission line and having a length comparable to a quarter of the first electrical length; and
an eighth transmission line having one end connected to another end of the seventh transmission line and electromagnetically coupled to the fifth transmission line, the eighth transmission line having a length comparable to a quarter of the first electrical length,
wherein another end of the fifth transmission line and another end of the eighth transmission line are both connected to a ground, or are both open-circuited, or are connected to two respective terminating resistors whose resistance values are equal to each other.

4. The filter circuit as claimed in claim 1, wherein the first transmission line, the second transmission line, the third transmission line, and the fourth transmission line have an equal length.

5. The filter circuit as claimed in claim 1, wherein the first transmission line and the fourth transmission line extend in parallel to, and in proximity of, each other.

6. A filter circuit comprising:
a first branch line coupler having a first terminal, a second terminal, a third terminal, and a fourth terminal which are connected together in this order through a first conductor line forming a loop, the first terminal serving as a first input port, and the fourth terminal serving as a first output port; and
a first balun circuit connected to one of the second terminal and the third terminal,
wherein the first balun circuit includes:
a first input terminal connected to the one of the second terminal and the third terminal to receive a radio-frequency signal;
a first transmission line having one end connected to the first input terminal and having a length comparable to a quarter of a first electrical length of one wavelength at a frequency of the radio-frequency signal;
a second transmission line having one end connected to the first input terminal and having a length comparable to a quarter of the first electrical length;
a third transmission line having one end connected to another end of the second transmission line and having a length comparable to a quarter of the first electrical length; and
a fourth transmission line having one end connected to another end of the third transmission line and electromagnetically coupled to the first transmission line, the fourth transmission line having a length comparable to a quarter of the first electrical length,
wherein another end of the first transmission line and another end of the fourth transmission line are both connected to a ground, or are both open-circuited, or are connected to two respective terminating resistors whose resistance values are equal to each other, and
wherein the first transmission line and the fourth transmission line have an equal length, and the second transmission line and the third transmission line have an equal length, with the length of the first transmission line and the fourth transmission line and the length of the second transmission line and the third transmission line being different from each other.

7. The filter circuit as claimed in claim 6, further comprising a second balun circuit connected to another one of the second terminal and the third terminal,
wherein the second balun circuit includes:
a second input terminal connected to the another one of the second terminal and the third terminal to receive the radio-frequency signal;
a fifth transmission line having one end connected to the second input terminal and having a length comparable to a quarter of the first electrical length;
a sixth transmission line having one end connected to the second input terminal and having a length comparable to a quarter of the first electrical length;
a seventh transmission line having one end connected to another end of the sixth transmission line and having a length comparable to a quarter of the first electrical length; and
an eighth transmission line having one end connected to another end of the seventh transmission line and electromagnetically coupled to the fifth transmission line, the eighth transmission line having a length comparable to a quarter of the first electrical length,
wherein another end of the fifth transmission line and another end of the eighth transmission line are both connected to a ground, or are both open-circuited, or are connected to two respective terminating resistors whose resistance values are equal to each other.

8. The filter circuit as claimed in claim 6, wherein the first transmission line and the fourth transmission line extend in parallel to, and in proximity of, each other.

9. The filter circuit as claimed in claim 6, wherein the first transmission line, the second transmission line, the third transmission line, and the fourth transmission line have an equal length.

10. The filter circuit as claimed in claim 6, wherein the first branch line coupler is configured such that the first terminal, the second terminal, the third terminal, and the fourth terminal are connected in this order through the first conductor line having a rectangular loop shape.

11. A filter circuit comprising:
a first branch line coupler having a first terminal, a second terminal, a third terminal, and a fourth terminal which are connected together in this order through a first conductor line forming a loop, the first terminal serving as a first input port, and the fourth terminal serving as a first output port;
a first balun circuit connected to one of the second terminal and the third terminal,
a second branch line coupler having a fifth terminal, a sixth terminal, a seventh terminal, and an eighth terminal which are connected together in this order through a second conductor line forming a loop, the fifth terminal serving as a second input port, and the eighth terminal serving as a second output port; and
a second balun circuit connected to one of the sixth terminal and the seventh terminal,
wherein the first balun circuit includes:
a first input terminal connected to the one of the second terminal and the third terminal to receive a radio-frequency signal;
a first transmission line having one end connected to the first input terminal and having a length comparable to a quarter of a first electrical length of one wavelength at a frequency of the radio-frequency signal;
a second transmission line having one end connected to the first input terminal and having a length comparable to a quarter of the first electrical length;
a third transmission line having one end connected to another end of the second transmission line and having a length comparable to a quarter of the first electrical length; and
a fourth transmission line having one end connected to another end of the third transmission line and electromagnetically coupled to the first transmission line, the fourth transmission line having a length comparable to a quarter of the first electrical length,
wherein another end of the first transmission line and another end of the fourth transmission line are both connected to a ground, or are both open-circuited, or are connected to two respective terminating resistors whose resistance values are equal to each other, and
wherein the second balun circuit includes:
a second input terminal connected to the one of the sixth terminal and the seventh terminal to receive a radio-frequency signal transmitted through the second branch line coupler;
a fifth transmission line having one end connected to the second input terminal and having a length comparable to a quarter of a second electrical length of one wavelength at a frequency of the radio-frequency signal transmitted through the second branch line coupler;
a sixth transmission line having one end connected to the second input terminal and having a length comparable to a quarter of the second electrical length;
a seventh transmission line having one end connected to another end of the sixth transmission line and having a length equal to a quarter of the second electrical length; and
an eighth transmission line having one end connected to another end of the seventh transmission line and electromagnetically coupled to the fifth transmission line, the eighth transmission line having a length comparable to a quarter of the second electrical length,
wherein another end of the fifth transmission line and another end of the eighth transmission line are both connected to a ground, or are both open-circuited, or are connected to two respective terminating resistors whose resistance values are equal to each other.

12. The filter circuit as claimed in claim 11, wherein the first branch line coupler is configured such that the first terminal, the second terminal, the third terminal, and the fourth terminal are connected in this order through the first conductor line having a rectangular loop shape.

13. The filter circuit as claimed in claim 11, wherein the first transmission line and the fourth transmission line extend in parallel to, and in proximity of, each other.

14. The filter circuit as claimed in claim 11, wherein the first transmission line, the second transmission line, the third transmission line, and the fourth transmission line have an equal length.

15. The filter circuit as claimed in claim 11, further comprising a second balun circuit connected to another one of the second terminal and the third terminal,
wherein the second balun circuit includes:
a second input terminal connected to the another one of the second terminal and the third terminal to receive the radio-frequency signal:
a fifth transmission line having one end connected to the second input terminal and having a length comparable to a quarter of the first electrical length;
a sixth transmission line having one end connected to the second input terminal and having a length comparable to a quarter of the first electrical length;
a seventh transmission line having one end connected to another end of the sixth transmission line and having a length comparable to a quarter of the first electrical length; and
an eighth transmission line having one end connected to another end of the seventh transmission line and electromagnetically coupled to the fifth transmission line, the eighth transmission line having a length comparable to a quarter of the first electrical length,
wherein another end of the fifth transmission line and another end of the eighth transmission line are both connected to a ground, or are both open-circuited, or are connected to two respective terminating resistors whose resistance values are equal to each other.

16. The filter circuit as claimed in claim 11, wherein the length of the first conductor line of the first branch line coupler and the length of the second conductor line of the second branch line coupler are different from each other, and
the length of the first transmission line and the fourth transmission line in the first balun circuit and the length of the fifth transmission line and the eighth transmission line in the second balun circuit are different from each other, and
wherein the length of the second transmission line and the third transmission line in the first balun circuit and the length of the sixth transmission line and the seventh transmission line in the second balun circuit are different from each other.

\* \* \* \* \*